(12) United States Patent
Carlson

(10) Patent No.: US 9,534,295 B2
(45) Date of Patent: Jan. 3, 2017

(54) CHAMBER PRESSURE CONTROL APPARATUS FOR CHEMICAL VAPOR DEPOSITION SYSTEMS

(71) Applicant: Applied Materials, Inc., Santa Clara, CA (US)

(72) Inventor: David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 148 days.

(21) Appl. No.: 14/304,548

(22) Filed: Jun. 13, 2014

(65) Prior Publication Data

US 2015/0020891 A1    Jan. 22, 2015

Related U.S. Application Data

(60) Provisional application No. 61/847,425, filed on Jul. 17, 2013.

(51) Int. Cl.

| | |
|---|---|
| *F17D 1/02* | (2006.01) |
| *F17C 1/00* | (2006.01) |
| *C23C 16/44* | (2006.01) |
| *C23C 16/455* | (2006.01) |
| *C23C 16/52* | (2006.01) |

(52) U.S. Cl.
CPC ..... *C23C 16/4412* (2013.01); *C23C 16/45557* (2013.01); *C23C 16/52* (2013.01); *F17C 1/00* (2013.01); *F17D 1/02* (2013.01); *Y10T 137/0396* (2015.04); *Y10T 137/2931* (2015.04)

(58) Field of Classification Search
CPC .............. F17D 1/02; F17C 1/00; C23C 16/52; C23C 16/4412; C23C 16/45557; Y10T 137/2931; Y10T 137/0396
USPC ....................... 137/613, 512, 513; 138/44, 45
See application file for complete search history.

(56) References Cited

U.S. PATENT DOCUMENTS

| | | | | |
|---|---|---|---|---|
| 2,842,962 | A * | 7/1958 | Dall | G01F 1/44 138/44 |
| 3,733,901 | A * | 5/1973 | Halmi | G01F 1/44 138/44 |
| 7,530,603 | B2 * | 5/2009 | Fernandes et al. | F16L 41/084 285/192 |
| 2014/0205429 | A1 * | 7/2014 | Harwell et al. | F16L 23/18 415/1 |

* cited by examiner

*Primary Examiner* — Kevin Lee
(74) *Attorney, Agent, or Firm* — Patterson & Sheridan, LLP

(57) ABSTRACT

In one embodiment, a pressure control assembly includes a cylindrical hollow body having an opening to receive a ballast gas, a first and second flange, and a first and second cone. The first flange is coupled to a first end of the body, and a second flange is coupled to an opposing end of the body. The first cone is coupled to the first flange, and second cone is coupled to the second flange. A method for controlling pressure in a chamber includes measuring a pressure of the chamber and a pressure of an exhaust system coupled to the chamber. The method includes dynamically adjusting the pressure in the exhaust system in order to adjust the pressure in the chamber, by creating a first pressure drop that is greater than a second pressure drop in the exhaust system.

19 Claims, 3 Drawing Sheets

CHAMBER PRESSURE CONTROL APPARATUS FOR CHEMICAL VAPOR DEPOSITION SYSTEMS

CROSS-REFERENCE TO RELATED APPLICATION

This application claims benefit of U.S. Provisional Application Ser. No. 61/847,425, filed Jul. 17, 2013, which is incorporated by reference in its entirety.

BACKGROUND

Field

Embodiments disclosed herein generally relate to an apparatus and method for controlling the pressure of a processing chamber. More particularly, embodiments herein relate to a dynamic pressure control system.

Description of the Related Art

Substrates, such as semiconductor substrates, can be subjected to an epitaxial growth process to form an epitaxial layer on a surface of the substrate. Conventional epitaxial growth processes include flowing a process gas laterally over the surface of the substrate, and thermally decomposing the process gas on the surface of the substrate in order to deposit the epitaxial layer.

After deposition, process gases remaining in the atmospheric pressure epitaxial growth systems are carried out of the processing chamber to facilitate exhaust through an abatement system. Due to this configuration, the pressure in the processing chamber is affected by the surrounding atmospheric pressure and the exhaust side abatement system (i.e., to remove byproduct clogging), thus there is risk for exhaust byproducts to flow back into the processing chamber by pressure oscillations in the processing chamber. Pressure fluctuations, or pressure spikes, in the processing chamber may result in non-uniform distribution of the processing gas. Therefore, maintaining a constant pressure inside the processing chamber is key for uniform deposition results.

One option for controlling pressure inside the processing chamber is through the use of a vacuum pump. However, atmospheric epitaxial growth systems configured with a vacuum pump can become unsafe due to faster pyrophoric byproduct build up and risk for explosion and fire in exhaust facilities. Therefore, atmospheric epitaxial growth systems are generally not configured with vacuum pump.

Another option for controlling pressure inside the processing chamber includes a pressure control system in the exhaust line to control fluctuations in pressure in atmospheric epitaxial growth systems. Conventional designs can reduce the processing chamber pressure fluctuations to some extent, but conventional designs lack a dynamic range of control.

Thus, there is a need for improved pressure control system processing chambers, and particularly in atmospheric processing chambers.

SUMMARY

In one embodiment, a pressure control system includes a cylindrical hollow body having an opening to receive a ballast gas, a first and second flange, and a first and second cone. The first flange is coupled to a first end of the body, and a second flange is coupled to an opposing second end of the body. The first cone is coupled to the first flange at the first end, and the first cone has a first and second opening. The first opening of the first cone is at the first flange. The second cone is coupled to the second flange at the second end of the body. The second cone has a first and second opening, and the first opening of the second cone faces the second opening of the first cone. The second opening of the second cone is at the second flange.

In another embodiment, a method for controlling pressure in a processing chamber includes measuring a pressure of the processing chamber; and measuring a pressure of an exhaust system coupled to the processing chamber. The method further includes dynamically adjusting the pressure in the exhaust system in order to adjust the pressure in the processing chamber. Dynamically adjusting the pressure in the exhaust system includes creating a first pressure drop in the exhaust system, and creating a second pressure drop in the exhaust system. The first pressure drop is greater than the second pressure drop.

In yet another embodiment, a processing chamber includes a chamber body and an exhaust system. The chamber body has an exhaust port formed therein and the exhaust system is coupled to the exhaust port. The exhaust system includes a pressure control assembly configured to dynamically control a pressure in the chamber body by creating a first and second pressure drop in the exhaust system. The first pressure drop is greater than the second pressure drop.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments disclosed herein generally relate to a system for increased pressure control of atmospheric deposition processing chambers. By controlling flow through the exhaust system, atmospheric pressure changes are prevented from translating into the processing chamber. Thus, the processing conditions of atmospheric systems can be better controlled. The embodiments disclosed herein are more clearly described with reference to the figures below.

Figure 1:
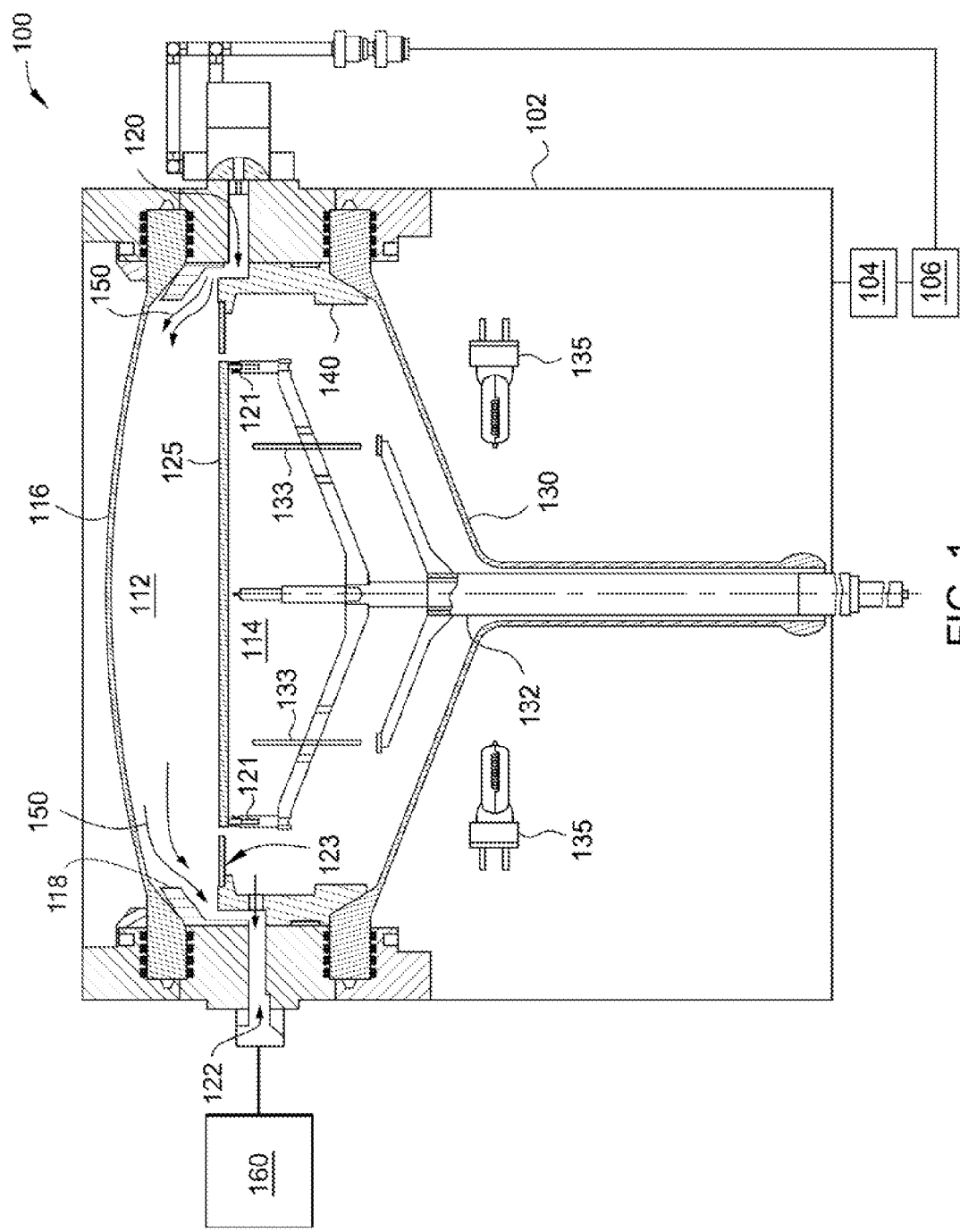
FIG. 1 is a partial cross-sectional view of a processing chamber according to embodiments described herein.

A variety of processing chambers may be modified to incorporate the embodiments described herein. In one embodiment, atmospheric chemical vapor deposition (CVD) chambers incorporate the embodiments described herein. One example of a CVD chamber is the epitaxial (EPI) CENTURA® system for atmospheric CVD systems, available from Applied Materials, Inc., of Santa Clara, Calif. The CENTURA® system is a fully automated semiconductor fabrication system, employing a single wafer, multi-chamber, modular design, which accommodates a wide variety of wafer sizes. In addition to the CVD chamber, the multiple chambers may include a pre-clean chamber, wafer orienter chamber, cooldown chamber, and independently operated loadlock chamber. The CVD chamber presented herein is shown in schematic in FIG. 1 is one embodiment and is not intended to be limiting of all possible embodiments. It is envisioned that other atmospheric or near atmospheric CVD chambers can be used in accordance with embodiments described herein, including chambers from other manufacturers.

Embodiments disclosed herein may be practiced in the CENTURA® EPI chamber, available from Applied Materials, Inc. of Santa Clara, Calif. It is contemplated that other chambers available from other manufacturers may also benefit from embodiments disclosed herein.

FIG. 1 is a partial cross-sectional view of a processing chamber 100 according to one embodiment. The processing chamber 100 includes a chamber body 102, support systems 104, and a chamber controller 106. The chamber body 102 that includes an upper portion 112 and a lower portion 114. The upper portion 112 includes an area within the chamber body 102 between an upper dome 116 and an upper surface of a substrate 125. The lower portion 114 includes an area within the chamber body 102 between a lower dome 130 and a bottom of the substrate 125. Deposition processes generally occur on the upper surface of the substrate 125 within the upper portion 112. The substrate 125 is supported by support pins 121 disposed beneath the substrate 125.

An upper liner 118 is disposed within the upper portion 112 and is adapted to prevent undesired deposition onto chamber components. The upper liner 118 is positioned adjacent to a ring 123 within the upper portion 112. The processing chamber 100 includes a plurality of heat sources, such as lamps 135, which are adapted to provide thermal energy to components positioned within the processing chamber 100. For example, the lamps 135 may be adapted to provide thermal energy to the substrate 125 and the ring 123. The lower dome 130 may be formed from an optically transparent material, such as quartz, to facilitate the passage of thermal radiation therethrough.

The chamber body 102 also includes an inlet 120 and an exhaust port 122 formed therein. The inlet 120 may be adapted to provide a process gas 150 into the upper portion 112 of the chamber body 102, while the exhaust port 122 may be adapted to exhaust the process gas 150 from the upper portion 112 into an exhaust system 160. Details of the exhaust system will be discussed further below in reference to FIGS. 2 and 3. In such a manner, the process gas 150 may flow parallel to the upper surface of the substrate 125. In one embodiment, thermal decomposition of the process gas 150 onto the substrate 125 forms an epitaxial layer on the substrate 125, facilitated by the lamps 135.

A substrate support assembly 132 is positioned in the lower portion 114 of the chamber body 102. The substrate support assembly 132 is illustrated supporting the substrate 125 in a processing position. The substrate support assembly 132 includes a plurality of support pins 121 and a plurality of lift pins 133. The lift pins 133 are vertically actuatable and are adapted to contact the bottom of the substrate 125 to lift the substrate 125 from a processing position (as shown) to a substrate removal position. The components of the substrate support assembly 132 can be fabricated from quartz, silicon carbide, graphite coated with silicon carbide or other suitable materials.

The ring 123 can removably disposed on a lower liner 140 that is coupled to the chamber body 102. The ring 123 can be disposed around the internal volume of the chamber body 102 and circumscribes the substrate 125 while the substrate 125 is in a processing position. The ring 123 can be formed from a thermally-stable material such as silicon carbide, quartz or graphite coated with silicon carbide. The ring 123, in combination with the position of the substrate 125, can separate a processing volume of the upper potion 112. The ring 123 can provide proper gas flow through the upper portion 112 when the substrate 125 is positioned level with the ring 123. The separate volume of the upper portion 112 enhances deposition uniformity by controlling the flow of process gas as the process gas is provided to the processing chamber 100.

The support system 104 includes components used to execute and monitor pre-determined processes, such as the growth of epitaxial films in the processing chamber 100. In one embodiment, the support system 104 includes one or more of gas panels, gas distribution conduits, power supplies, and process control instruments. A chamber controller 106 is coupled to the support system 104 and is adapted to control the processing chamber 100 and the support system 104. In one embodiment, the chamber controller 106 includes a central processing unit (CPU), a memory, and support circuits. Instructions residing in the chamber controller 106 may be executed to control the operation of the processing chamber 100. The processing chamber 100 is adapted to perform one or more film formation or deposition processes therein. For example, a silicon carbide epitaxial growth process may be performed within processing chamber 100. It is contemplated that other processes may be performed within processing chamber 100.

Figure 2:
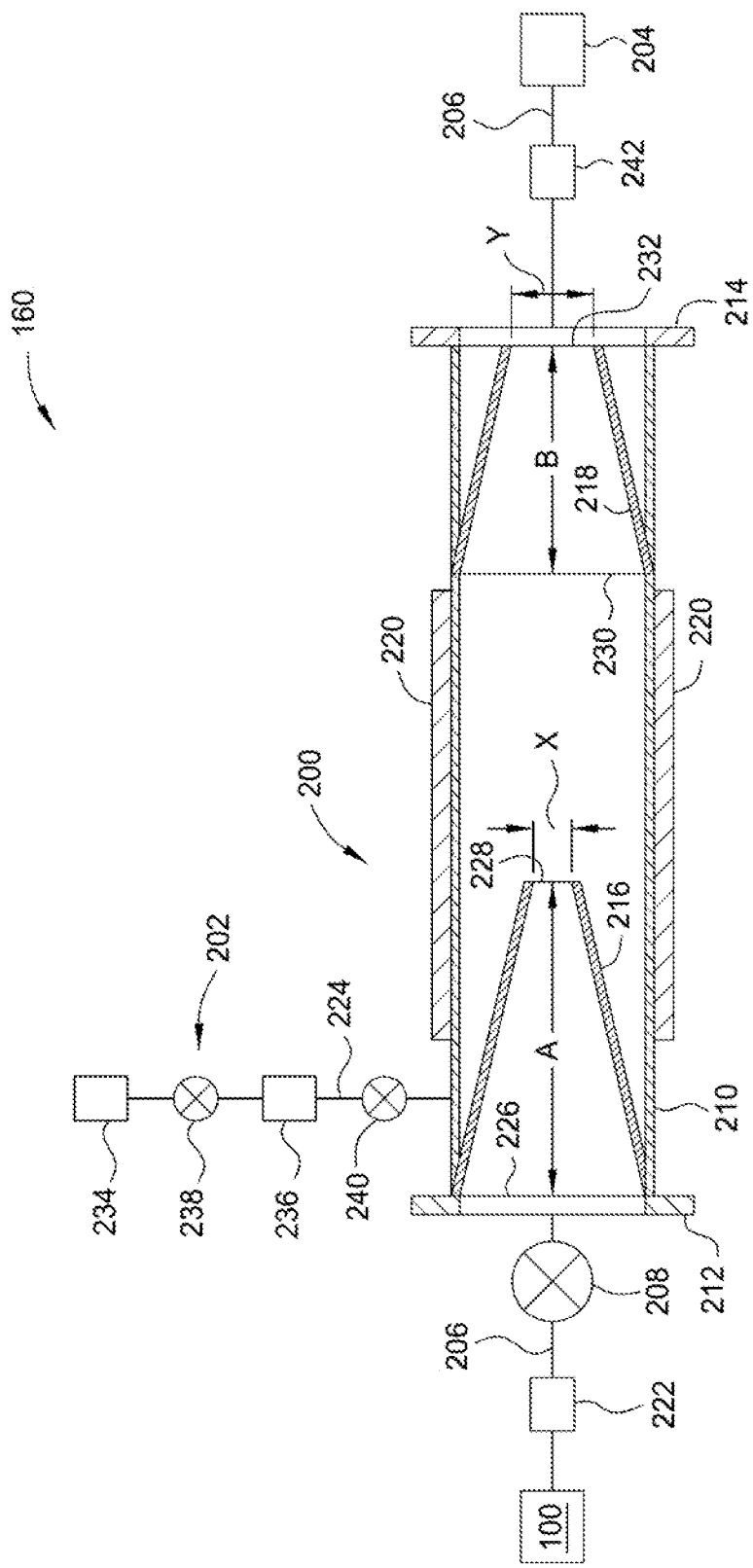
FIG. 2 is a partial cross-sectional view of the exhaust system for the processing chamber described in FIG. 1.
Figure 3:
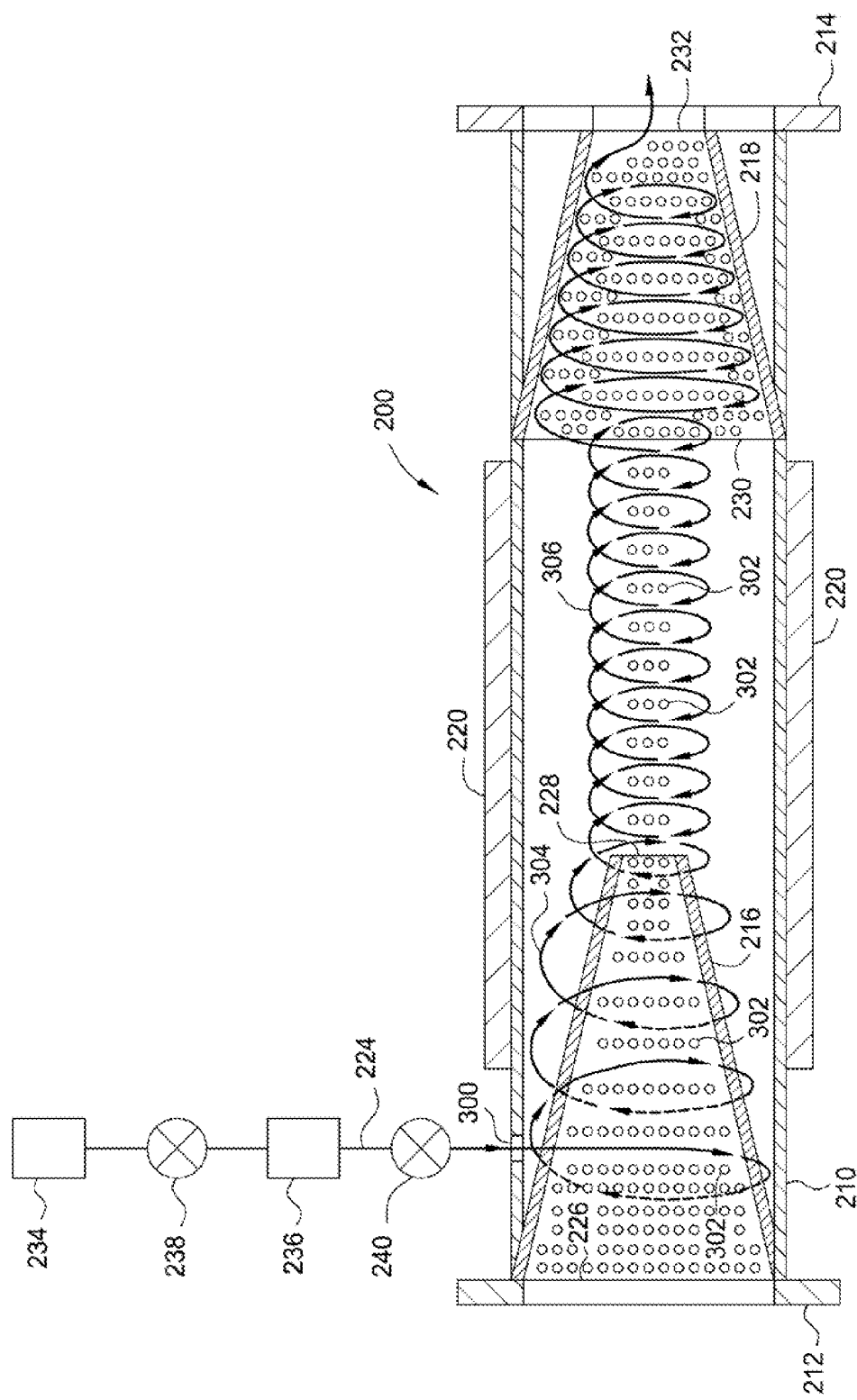
FIG. 3 is an enlarged cross-sectional view of a dynamic pressure control system described in FIG. 2.

FIG. 2 is a partial cross-sectional view of the exhaust system 160, and FIG. 3 is an enlarged cross-sectional view of a dynamic pressure control assembly 200. Referring to FIGS. 2 and 3, the exhaust system 160 includes the dynamic pressure control assembly 200, a gas delivery system 202, and an atmospheric abatement system 204. The dynamic pressure control assembly 200 is configured to actively and dynamically control the pressure in exhaust system 160, and therefore, control the pressure in the processing chamber 100. The gas delivery system 202 is configured to supply gas to the dynamic pressure control assembly 200, and the abatement system 204 is configured to treat effluent gases from the processing chamber 100.

The dynamic pressure control assembly 200 is located on the exhaust side of the processing chamber 100 and connected to the processing chamber 100 by an exhaust line 206. In one embodiment, the exhaust line 206 may be fluidly connected to an isolation valve 208 that is configured to isolate the processing chamber 100 from the dynamic pressure control assembly 200, and fluidly connected to a first pressure detection device 222. The first pressure detection device 222 is configured to determine a variety of pressures and pressure ranges in the exhaust line 206 coming from the processing chamber 100. In one embodiment, the first pressure detection device 222 is a transducer, such as a vacuum transducer.

The dynamic pressure control assembly 200 includes a hollow cylindrical body 210 having a first flange 212 and a second flange 214 disposed on opposing ends of the body 210. In one embodiment, the length of the body 210 is about 4 to about 8 inches, for example about 6 inches. The flanges 212, 214 may be coupled to the body 210 by welding or other suitable methods. In another embodiment, the flanges 212, 214 are KF40 or KF50 flanges having an opening diameter between about 1 inch to about 3 inches, for example about 1.5 inches or about 2 inches. A bellow 220 may be welded on an outer surface of the body 210. The bellow 220 is configured to expand and retract the body 210 as a function of the pressure inside the body 210. In one embodiment, the body 210, the flanges 212, 214 and the bellow 220 are fabricated from stainless steel, for example, 316L stainless steel.

The body 210 also includes a first hollow cone 216 disposed inside the body 210 and coupled to the first flange 212, and a second hollow cone 218 disposed inside the body 210 and coupled to the second flange 214. In one embodiment, the first and second cones 216, 218 are fabricated from stainless steel, for example, 316L stainless steel. The first cone 216 is disposed on an upstream side of the body 210 adjacent the processing chamber 100, and the second cone 218 is disposed on a downstream side of the body 210 adjacent the abatement system 204. A first opening 226 of the first cone 216 faces the first flange 212, and an opposing second opening 228 faces the second cone 218. In one embodiment, the first opening 226 is greater, such as larger, than the second opening 228. A first opening 230 of the second cone 218 faces the second opening 228 of the first cone 216, and an opposing second opening 232 faces the second flange 214. In one embodiment, the first opening 230 is greater, such as larger, than the second opening 232. In one embodiment, a length "A" of the first cone 216 is greater than a length "B" of the second cone 218. In another embodiment, a width "X" of the second opening 228 of the first cone 216 is smaller than a width "Y" of the second opening 232 of the second cone 218. Therefore, the cross-sectional area of the second opening 228 of the first cone 216 is smaller than the cross-sectional area of the second opening 232 of the second cone 218. In one embodiment, a second pressure detection device 242 is fluidly coupled to the exhaust line 206 downstream of the dynamic pressure control assembly 200 to determine a variety of pressures and pressure ranges in the exhaust line 206 coming from the abatement system 204. In one embodiment, the second pressure detection device 242 is a transducer, such as a vacuum transducer.

The gas delivery system 202 is fluidly coupled to the dynamic pressure control assembly 200 through a gas delivery line 224 at an opening 300 in the body 210. The opening 300 is located near the first opening 226 of the first cone 216. The gas delivery system 202 includes a ballast gas source 234, a mass flow controller 236, a ballast gas shut-off valve 238, and a mass flow controller shut-off valve 240. The ballast gas source 234 is configured to supply ballast gas, such as argon, nitrogen, or any other suitable ballast gases, in the body 210. The mass flow controller 236 is configured to measure and control the flow of the ballast gas from the ballast gas source 234 into the body 210. In embodiment, the mass flow controller 236 is a fast response mass flow controller. The ballast gas shut-off valve 238 is disposed between the ballast gas source 234 and the mass flow controller 236. The ballast gas shut-off valve 238 is configured to selectively close and isolate the ballast gas source 234 from the mass flow controller 236. The mass flow controller shut-off valve 240 is disposed between the mass flow controller 236 and the opening 300. The mass flow controller shut-off valve 240 is configured to selectively close and isolate the ballast gas (flowing from the mass flow controller 236) from the opening 300.

The abatement system 204 is fluidly coupled to the dynamic pressure control assembly 200 through the exhaust line 206 at a downstream side of the body 210. In one embodiment, the abatement system 204 is a wet scrubber configured to remove hazardous species from the gas coming from the dynamic pressure control assembly 200.

Referring to FIGS. 1-3, in one mode of operation, the process gas 150 is exhausted into the exhaust system 160, and the process gas and the process byproducts 302 enter the dynamic pressure control assembly 200. The process byproducts 302 enter the first opening 226 of the first cone 216 and travel the length A to exit through the second opening 228 of the first cone 216. Additionally, a ballast gas 304, such as nitrogen or argon, is supplied from the ballast gas source 234 and delivered through the opening 300 into the body 210. In one embodiment, the ballast gas 304 is injected into the body 210 at angle that is not perpendicular to the opening 300, such as about 20 degrees or about 40 degrees, for example about 30 degrees. The injection angle is configured to create a vortex 306 of the ballast gas 304 in the body 210. As discussed above, supply of the ballast gas 304 to the body 210 is controlled by the mass flow controller 236. As the ballast gas 304 enters the body 210, the ballast gas 304 travels around the first cone 216 to create the vortex 306 that forms a sheath around the process byproducts 302 exiting the second opening 228. The vortex 306 of ballast gas 304, which encapsulates the byproducts 302, then enters the first opening 230 of the second cone 218. The vortex 306 encapsulating the byproducts 302 then travels the length B to exit through the second opening 232 of the second cone 218 and into the abatement system 204.

In one embodiment, the byproducts 302 may be heavy molecules, such as cholorosilanes or tricholorsilane (SiHCl3), that tend to polymerize in the exhaust system 160. As one skilled in the art would understand, tricholorsilane tends to form long chain polymers at a certain thermal point, for example seven chains or greater, in the exhaust system 160 that results in a viscous substance. The viscous substance not only damages and dirties the exhaust system 160, for example the inside of the dynamic pressure control assembly body 210, but tricholorsilane forms a contact explosive when oxidized (i.e., contacts air). However, the above described vortex 306 of ballast gas 304, for example nitrogen or argon, advantageously suppresses and stops the polymerization reaction of the tricholorsilane by prolonging the travel length of the tricholorsilane to reach a desired temperature gradient suitable to suppress polymerization. In one embodiment, the polymerization is suppressed and controlled at a temperature range of between about 50 degrees Celsius to about 140 degrees Celsius, for examples about 60 degrees Celsius to about 130 degrees Celsius. Additionally, the vortex 306 protects the inside of the dynamic pressure control assembly body 210 from the polymerized tricholorsilane byproduct 302 that are within the vortex 306.

In another embodiment, the exhaust system 160 maintains the pressure constant in the processing chamber 100 by controlling the flow of the negative pressure from the exhaust system 160. In one embodiment, the negative pressure from the exhaust system 160 is controlled by the flow of the ballast gas 304 in the dynamic pressure control assembly 200 and the bellow 220. In one embodiment, a mix of hydrogen and tricholorsilane byproduct 302 travels through the length A of the first cone 216, and creates a first pressure drop as it exits through the cross-sectional area of the second opening 228. By injecting the ballast gas 304 around the second opening 228, the vortex 306 re-constrains the exiting hydrogen and byproduct 302 and flows the hydrogen and byproduct 302 into the second cone 218 to create a second pressure drop in the second cone 218 as the byproducts 302 exit through the cross-sectional area of the second opening 232. In one embodiment, only the heavier byproduct 302 is entrained in the vortex 306 and the hydrogen deposits on the inside of the body 210. In one embodiment, the second pressure drop is less than the first pressure drop, because the cross-sectional area of the second opening 232 of the second cone 218 is greater than the cross-sectional area of the second opening 228 of the first cone 216. Therefore, the pressure created by the vortex 306 flow can compensate for and control the negative pressure from the exhaust system 160, by controlling the second pressure drop in the second cone 218.

In one embodiment, the first pressure detection device 222 measures the pressure coming from the processing chamber 100, and the second pressure detection device 242 measures the negative pressure from the abatement system 204. The mass flow controller 236 communicates with the first and second pressure detection devices 222, 242 to adjust the flow of ballast gas 304 in the dynamic pressure control assembly 200 in order control the negative pressure from the abatement system 204, and therefore maintain constant pressure in the processing chamber 100. Additionally, the bellow 220 expands and retracts the body 210 as a function of the pressure inside the body 210 from the vortex 306. For example, if the flow of hydrogen and the byproducts 302 from the processing chamber 100 increases, the amount of ballast gas 304 supplied in the body 210 decreases and the bellows 220 expand to allow more volume in the body 210 (to compensate for the increased flow of hydrogen and the byproducts 302). However, if the flow of hydrogen and the byproducts 302 from the processing chamber 100 decreases, the amount of ballast gas 304 supplied in the body 210 increases and the bellows 220 retract to create less volume in the body 210 (to compensate for the decreased flow of hydrogen and the byproducts 302). Thus, the dynamic pressure control assembly 200 actively controls the pressure fluctuations in the abatement system 204, and therefore actively controls the pressure constant in the processing chamber 100. Therefore, the overall quality and uniformity of deposition products as formed in processing chamber 100 can be increased.

While the foregoing is directed to embodiments of the disclosure, other and further embodiments of the disclosure may be devised without departing from the basic scope thereof.

The invention claimed is:

1. A pressure control assembly, comprising:
a cylindrical hollow body having an opening to receive a ballast gas;
a first flange coupled to a first end of the body;
a second flange coupled to an opposing second end of the body;
a first cone coupled to the first flange at the first end, wherein the first cone has a first and second opening, and wherein the first opening of the first cone is at the first flange; and
a second cone coupled to the second flange at the second end, wherein the second cone has a first and second opening, and wherein the first opening of the second cone faces the second opening of the first cone, and wherein the second opening of the second cone is at the second flange, wherein the first opening of the second cone is larger than the second opening of the second cone.

2. The pressure control assembly of claim 1, wherein a cross-sectional area of the second opening of the first cone is less than a cross-sectional area of the second opening of the second cone.

3. The pressure control assembly of claim 1, wherein the opening of the body receives the ballast gas in the body at an angle of between 20 degrees and 40 degrees.

4. The pressure control assembly of claim 1, wherein a length of the first cone is greater than a length of the second cone.

5. The pressure control assembly of claim 1, wherein a width of the second opening of the first cone is smaller than a width of the second opening of the second cone.

6. The pressure control assembly of claim 1, wherein a bellows is welded to an outer surface of the cylindrical hollow body.

7. The pressure control assembly of claim 6, wherein the first and second cones, and the bellows are fabricated from stainless steel.

8. The pressure control assembly of claim 1, wherein the first and second flanges have a diameter between 1 inch and 3 inches.

9. A pressure control assembly, comprising:
a body having a first flange and a second flange opposite the first flange;
a first cone disposed within the body and coupled to the first flange, wherein the first cone has a first opening at the first flange and a second opening opposite the first opening; and
a second cone disposed within the body and coupled to the second flange, wherein the second cone has a first opening facing the second opening of the first cone and a second opening at the second flange, wherein the first opening of the second cone is larger than the second opening of the second cone, wherein a cross-sectional area of the second opening of the first cone is smaller than a cross-sectional area of the second opening of the second cone.

10. The pressure control assembly of claim 9, wherein the first opening of the first cone is larger than the second opening of the first cone.

11. The pressure control assembly of claim 9, wherein a length of the first cone is greater than a length of the second cone.

12. The pressure control assembly of claim 9, wherein a width of the second opening of the first cone is smaller than a width of the second opening of the second cone.

13. The pressure control assembly of claim 9, wherein the body has an opening formed adjacent the first cone.

14. The pressure control assembly of claim 9, wherein the body is a cylindrical hollow body.

15. A pressure control assembly, comprising:
a body having a first flange and a second flange opposite the first flange;
a first cone disposed within the body and coupled to the first flange, wherein the first cone has a first opening at the first flange and a second opening opposite the first opening; and
a second cone disposed within the body and coupled to the second flange, wherein the second cone has a first opening facing the second opening of the first cone and a second opening at the second flange, wherein the first opening of the second cone is larger than the second opening of the second cone, wherein a length of the first cone is greater than a length of the second cone.

16. The pressure control assembly of claim 15, wherein a cross-sectional area of the second opening of the first cone is smaller than a cross-sectional area of the second opening of the second cone.

17. The pressure control assembly of claim 16, wherein a width of the second opening of the first cone is smaller than a width of the second opening of the second cone.

18. The pressure control assembly of claim 15, wherein the body has an opening formed adjacent the first cone.

19. The pressure control assembly of claim 15, wherein the body is a cylindrical hollow body.

* * * * *

UNITED STATES PATENT AND TRADEMARK OFFICE
CERTIFICATE OF CORRECTION

PATENT NO. : 9,534,295 B2
APPLICATION NO. : 14/304548
DATED : January 3, 2017
INVENTOR(S) : David K. Carlson It is certified that error appears in the above-identified patent and that said Letters Patent is hereby corrected as shown below:

In the Specification

In Column 6, Line 33, delete "cholorosilanes" and insert -- chlorosilanes --, therefor.

In Column 6, Line 33, delete "tricholorsilane" and insert -- trichlorosilane --, therefor.

In Column 6, Line 35, delete "tricholorsilane" and insert -- trichlorosilane --, therefor.

In Column 6, Line 41, delete "tricholorsilane" and insert -- trichlorosilane --, therefor.

In Column 6, Line 45, delete "tricholorsilane" and insert -- trichlorosilane --, therefor.

In Column 6, Line 46, delete "tricholorsilane" and insert -- trichlorosilane --, therefor.

In Column 6, Line 54, delete "tricholorsilane" and insert -- trichlorosilane --, therefor.

In Column 6, Line 63, delete "tricholorsilane" and insert -- trichlorosilane --, therefor.

Signed and Sealed this
Fourth Day of April, 2017

Michelle K. Lee
*Director of the United States Patent and Trademark Office*